United States Patent
Lee

(10) Patent No.: US 9,279,855 B2
(45) Date of Patent: Mar. 8, 2016

(54) SEMICONDUCTOR INTEGTRATED CIRCUIT INCLUDING TEST PADS

(71) Applicant: SK hynix Inc., Icheon-si Gyeonggi-do (KR)

(72) Inventor: Dong Uk Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 99 days.

(21) Appl. No.: 14/167,700

(22) Filed: Jan. 29, 2014

(65) Prior Publication Data

US 2015/0067430 A1 Mar. 5, 2015

(30) Foreign Application Priority Data

Aug. 30, 2013 (KR) .................. 10-2013-0103841

(51) Int. Cl.
- *G01R 31/317* (2006.01)
- *G11C 29/10* (2006.01)
- *G11C 29/12* (2006.01)
- *G11C 29/14* (2006.01)

(52) U.S. Cl.
CPC .......... *G01R 31/31713* (2013.01); *G11C 29/10* (2013.01); *G11C 29/1201* (2013.01); *G11C 29/14* (2013.01)

(58) Field of Classification Search
CPC ................................ G01R 31/31915
USPC .................. 714/734, 735, 726, 738, 744, 724
See application file for complete search history.

(56) References Cited

U.S. PATENT DOCUMENTS

| 4,090,984 A * | 5/1978 | Lin et al. ............... 252/511 |
| 4,775,978 A * | 10/1988 | Hartness .............. 714/770 |
| 6,184,720 B1* | 2/2001 | Kim et al. ................. 327/37 |
| 6,337,593 B1* | 1/2002 | Mizuno et al. ............ 327/534 |
| 6,831,294 B1* | 12/2004 | Nishimura et al. ........ 257/48 |
| 2003/0213953 A1* | 11/2003 | Sohn et al. .............. 257/48 |
| 2007/0101108 A1* | 5/2007 | Grossman et al. ....... 712/228 |

FOREIGN PATENT DOCUMENTS

| KR | 1020110041587 A | 4/2011 |
| KR | 1020110076692 A | 7/2011 |

* cited by examiner

*Primary Examiner* — Fritz Alphonse
(74) *Attorney, Agent, or Firm* — William Park & Associates Ltd.

(57) ABSTRACT

A semiconductor integrated circuit includes a test input/output port including test pads; an internal input interface configured to generate an internal clock, an internal address, an internal command, internal data and temporary storage data in response to external signals through the test input/output port; and an error detection block configured to determine whether the internal data and the temporary storage data are the same, and output a result through one test pad of the port. The internal input interface includes a data input/output block which generates the internal data and the data input/output block includes a temporary storage part which stores the internal data as the temporary storage data, a data output part which receives the temporary storage data, and a data input part which receives an output of the data output part and outputs it as the internal data.

19 Claims, 11 Drawing Sheets

SEMICONDUCTOR INTEGTRATED CIRCUIT INCLUDING TEST PADS

CROSS-REFERENCES TO RELATED APPLICATION

The present application claims priority under 35 U.S.C. §119(a) to Korean application number 10-2013-0103841, filed on Aug. 30, 2013, in the Korean Intellectual Property Office, which is incorporated herein by reference in its entirety.

BACKGROUND

1. Technical Field

Various embodiments relate to a semiconductor integrated circuit, and more particularly, to a semiconductor memory apparatus.

2. Related Art

Generally, a semiconductor integrated circuit, for example, a semiconductor memory apparatus may include a plurality of pads for communication with a system. The pad may be disposed in a signal transfer port of the semiconductor memory apparatus. As the semiconductor memory apparatus is highly integrated and is scaled down, the size of the pads is gradually decreasing.

Currently, a pad increasingly used among pads with scaled-down sizes is a micro bump. Since the size of such a micro bump is small, it is difficult to directly test the micro bump using the pin of test equipment. Although a test may be performed by mounting a semiconductor memory apparatus including micro bumps, to a substrate (for example, a printed circuit board: PCB), it is not in reason to test entire mass-produced semiconductor memory apparatuses by mounting them to a substrate.

While a semiconductor memory apparatus with micro bumps may be tested by providing test-pads with a size larger than the micro bumps, because the test-pads have a large size, it is difficult to realize high density semiconductor memory apparatus integrated in a large number of test-pads. Therefore, a technology capable of testing a semiconductor memory apparatus using a limited number of test pads is demanded.

SUMMARY

In an embodiment of the present invention, a semiconductor integrated circuit includes: a test input/output port including a plurality of test pads; an internal input interface configured to generate an internal clock, an internal address, an internal command, internal data and temporary storage data in response to external signals through the test input/output port; and an error detection block configured to determine whether the internal data and the temporary storage data are the same with each other, and output a determination result through one test pad of the test input/output port, wherein the internal input interface includes a data input/output block which generates the internal data, and wherein the data input/output block includes a temporary storage part which stores the internal data as the temporary storage data, a data output part which receives the temporary storage data, and a data input part which receives an output of the data output part and outputs it as the internal data.

In an embodiment of the present invention, a system comprising a semiconductor integrated circuit block, wherein the semiconductor integrated circuit block comprises: a test port including a plurality of test pads; an internal input interface configured to generate an internal signal and temporary storage data using the external signals provided through the test port; and an error detection block configured to compare the internal signal and the temporary storage data and output a comparing result through selected one of the plurality of test pads.

In an embodiment of the present invention, a system comprising a semiconductor integrated circuit block, wherein the semiconductor integrated circuit block is configured to include a plurality of test pads inputted signals for testing the semiconductor integrated circuit block, and a test result of the semiconductor integrated circuit block is outputted through at least one of the plurality of the test pads.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

Figure 1:
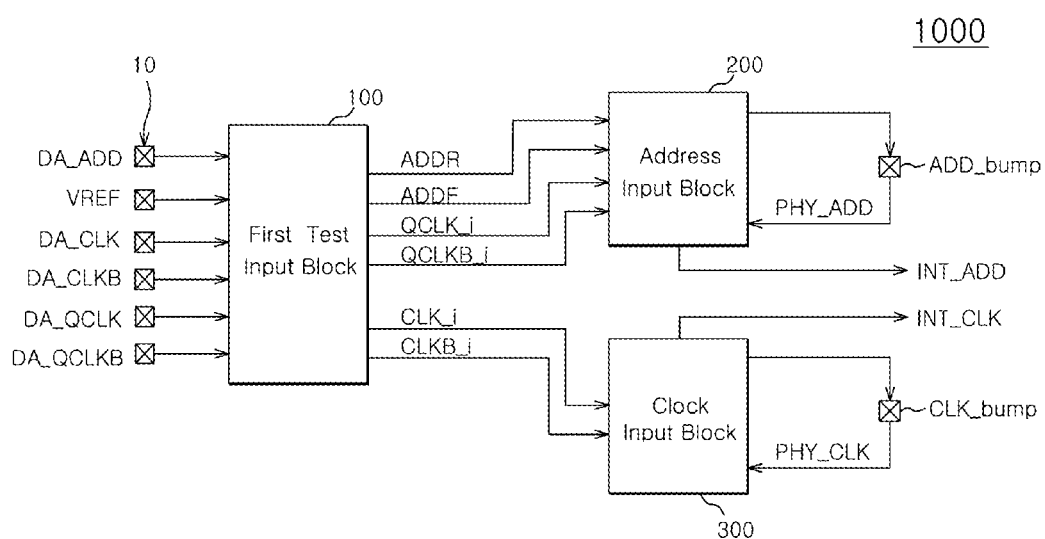
FIG. 1 is a block diagram of a semiconductor memory apparatus in accordance with an embodiment of the present disclosure.

As shown in FIG. 1, a semiconductor memory apparatus 1000 may include a first test input block 100, an address input block 200 and a clock input block 300.

The first test input block 100 may be configured to receive an address DA_ADD, a reference voltage VREF and clocks DA_CLK, DA_CLKB, DA_QCLK and DA_QCLKB which are externally inputted from test pads 10.

The test pad 10 may include a probe pad, a direct access pad, or the like. The address DA_ADD which is externally inputted is referred to as an external address DA_ADD, and the clocks DA_CLK and DA_CLKB which are externally inputted are respectively referred to as an external clock DA_CLK and an external clock bar DA_CLKB. Also, the clocks DA_QCLK and DA_QCLKB which are externally inputted are respectively referred to as an external write clock DA_QCLK and an external write clock bar DA_QCLKB.

The first test input block 100 may be configured to compare the voltage level of the external address DA_ADD and the voltage level of the reference voltage VREF, and generate a rising address ADDR by synchronizing a comparison result with the external clock DA_CLK. Further, the first test input block 100 may be configured to compare the voltage level of the external address DA_ADD and the voltage level of the reference voltage VREF, and generate a falling address ADDF by synchronizing a comparison result with the external clock bar DA_CLKB. The first test input block 100 may be driven the external clock DA_CLK, the external clock bar DA_CLKB, the external write clock DA_QCLK and the external write clock bar DA_QCLKB thereby generating an input clock CLK_i, an input clock bar CLKB_i, a write input clock QCLK_i and a write input clock bar QCLKB_i, respectively.

The address input block 200 may be configured to receive the rising address ADDR, the falling address ADDF, write input clock QCLK_i and the write input clock bar QCLKB_i from the first test input block 100. The clock input block 300 may be configured to receive the input clock CLK_i and the input clock bar CLKB_i.

Figure 2:
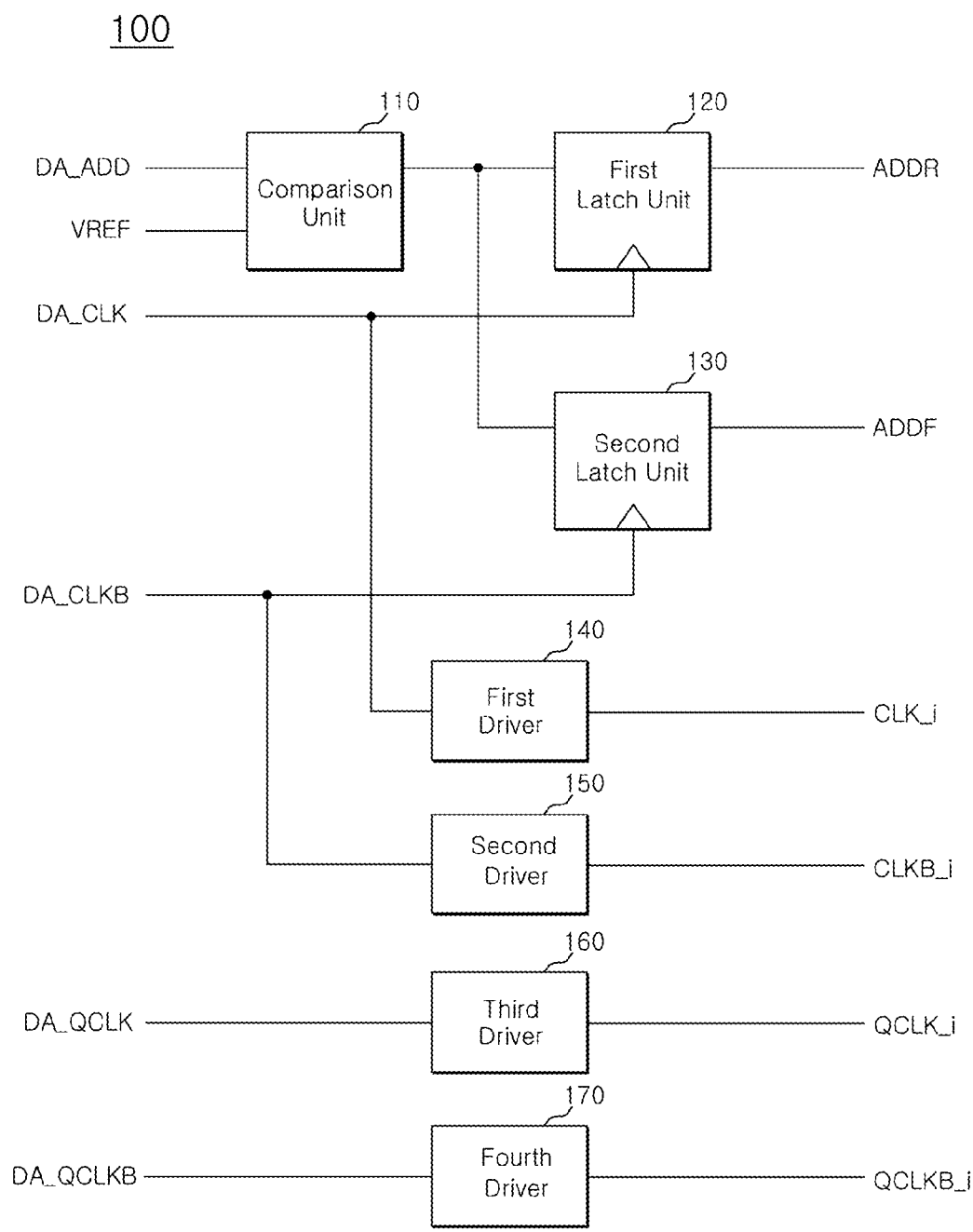
FIG. 2 is a block diagram of the first test input block of FIG. 1.

More detailed, referring to FIG. 2, the first test input block 100 may include a comparison unit 110, first and second latch units 120 and 130, and first to fourth drivers 140, 150, 160 and 170.

The comparison unit 110 may receive the external address DA_ADD and the reference voltage VREF. The comparison unit 110 may be configured to compare the voltage level of the external address DA_ADD and the voltage level of the reference voltage VREF. For example, the comparison unit 110 may be configured to be output a signal with a high level when the voltage level of the external address DA_ADD is higher than the voltage level of the reference voltage VREF, and output a signal with a low level when the voltage level of the external address DA_ADD is lower than the voltage level of the reference voltage VREF.

The first latch unit 120 may be configured to latch the output of the comparison unit 110 in response to the external clock DA_CLK, and output a latched signal as the rising address ADDR. For example, the first latch unit 120 may latch the output of the first comparison unit 110 at the rising timing of the external clock DA_CLK, and output the rising address ADDR.

The second latch unit 130 may be configured to latch the output of the comparison unit 110 in response to the external clock bar DA_CLKB, and output a latched signal as the falling address ADDF. For example, the second latch unit 130 may latch the output of the first comparison unit 110 at the rising timing of the external clock bar DA_CLKB, and output the falling address ADDF.

The first driver 140 may be configured to drive the external clock DA_CLK thereby outputting the input clock CLK_i.

The second driver 150 may be configured to drive the external clock bar DA_CLKB thereby outputting the input clock bar CLKB_i.

The third driver 160 may be configured to drive the external write clock DA_QCLK thereby outputting the write input clock QCLK_i.

The fourth driver 170 may be configured to drive the external write clock bar DA_QCLKB and output the write input clock bar QCLKB_i.

The address input block 200 of FIG. 1 may be configured to generate a PHY (physical layer) address PHY_ADD in response to the rising address ADDR, the falling address ADDF, the write input clock QCLK_i and the write input clock bar QCLKB_i, and output the PHY address PHY_ADD as an internal address INT_ADD.

Figure 3:
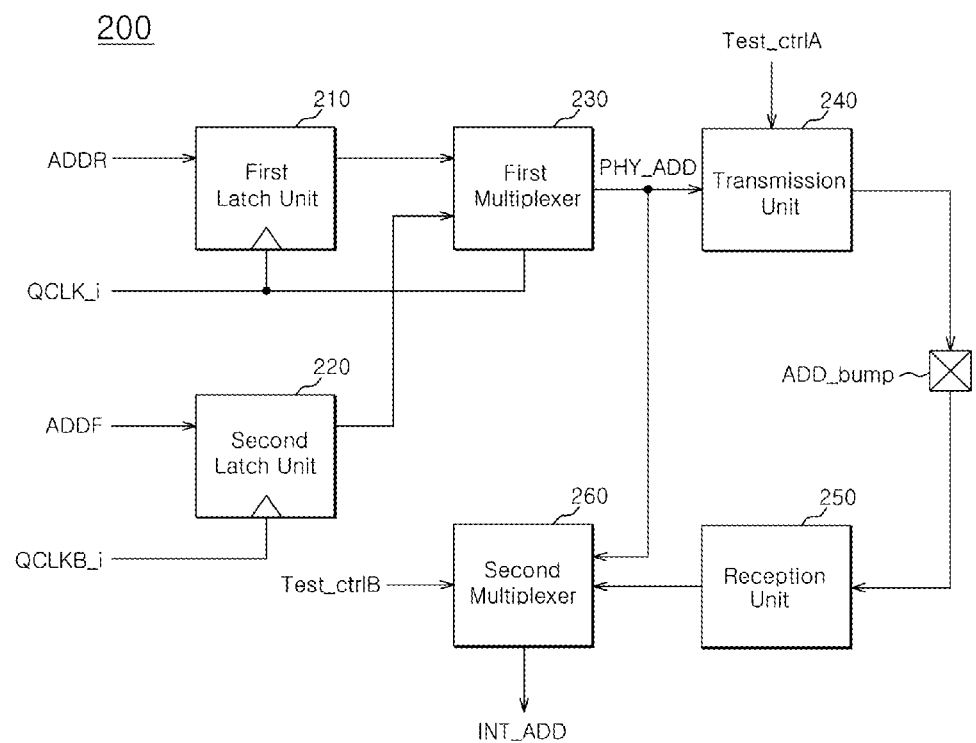
FIG. 3 is a block diagram of the address input block of FIG. 1.

Referring to FIG. 3, the address input block 200 may include a first latch unit 210, a second latch unit 220, a first multiplexer 230, a transmission unit 240, a reception unit 250, and a second multiplexer 260.

The first latch unit 210 may be configured to output the rising address ADDR in synchronization with the write input clock QCLK_i. For example, the first latch unit 210 latches and outputs the rising address ADDR at the rising timing of the write input clock QCLK_i.

The second latch unit 220 may be configured to output the falling address ADDF in synchronization with the write input clock bar QCLKB_i. For example, the second latch unit 220 latches and outputs the falling address ADDF at the rising timing of the write input clock bar QCLKB_i.

The first multiplexer 230 may be configured to select one of the output of the first latch unit 210 and the output of the second latch unit 220 as the PHY address PHY_ADD in response to the write input clock QCLK_i. For example, the first multiplexer 230 selects the output of the first latch unit 210 as the PHY address PHY_ADD when the write input clock QCLK_i is a high level, and selects the output of the second latch unit 220 as the PHY address PHY_ADD when the write input clock QCLK_i is a low level.

The transmission unit 240 may be configured to be activated in response to a first test control signal Test_ctrlA, and output the PHY address PHY_ADD to an address bump ADD_bump. For example, the transmission unit 240 may be activated when the first test control signal Test_ctrlA is enabled, and may transfer the PHY address PHY_ADD to the address bump ADD_bump. The transmission unit 240 may be deactivated when the first test control signal Test_ctrlA is disabled, and may block the PHY address PHY_ADD from being transferred to the address bump ADD_bump. The address bump ADD_bump may include a configuration for transferring the received address to an internal circuit (not shown) when a normal operation (not testing operation) although the address bump ADD_bump includes a type of a micro bump. The transmission unit 240 may be constituted by a general driver.

The reception unit 250 may be configured to receive the PHY address PHY_ADD inputted through the address bump ADD_bump, and provide the PHY address PHY_ADD to the second multiplexer 260. The reception unit 250 may be constituted by a general receiver.

The second multiplexer 260 may be configured to output the PHY address PHY_ADD outputted from the first multiplexer 230, as the internal address INT_ADD, or output the PHY address PHY_ADD outputted from the reception unit 250, as the internal address INT_ADD, in response to a second test control signal Test_ctrlB. For example, the second multiplexer 260 selects the output of the first multiplexer 230 as the internal address INT_ADD when the second test control signal Test_ctrlB is enabled, and selects the output of the reception unit 250 as the internal address INT_ADD when the second test control signal Test_ctrlB is disabled.

If an external command (not shown) instead of the external address DA_ADD is inputted to the first test input block 100 of FIG. 1, the address input block 200 may output an internal command (not shown). That is to say, a configuration for generating the external address DA_ADD as the internal address INT_ADD and a configuration for generating the external command as the internal command are the same with each other. The semiconductor memory apparatus may transfer an address and a command to the inside of the semiconductor memory apparatus by the configuration as shown in FIG. 1.

The clock input block 300 of FIG. 1 may be configured to generate a PHY (physical layer) clock PHY_CLK in response to the input clock CLK_i and the input clock bar CLKB_i, and output the PHY clock PHY_CLK as an internal clock INT_CLK.

Figure 4:
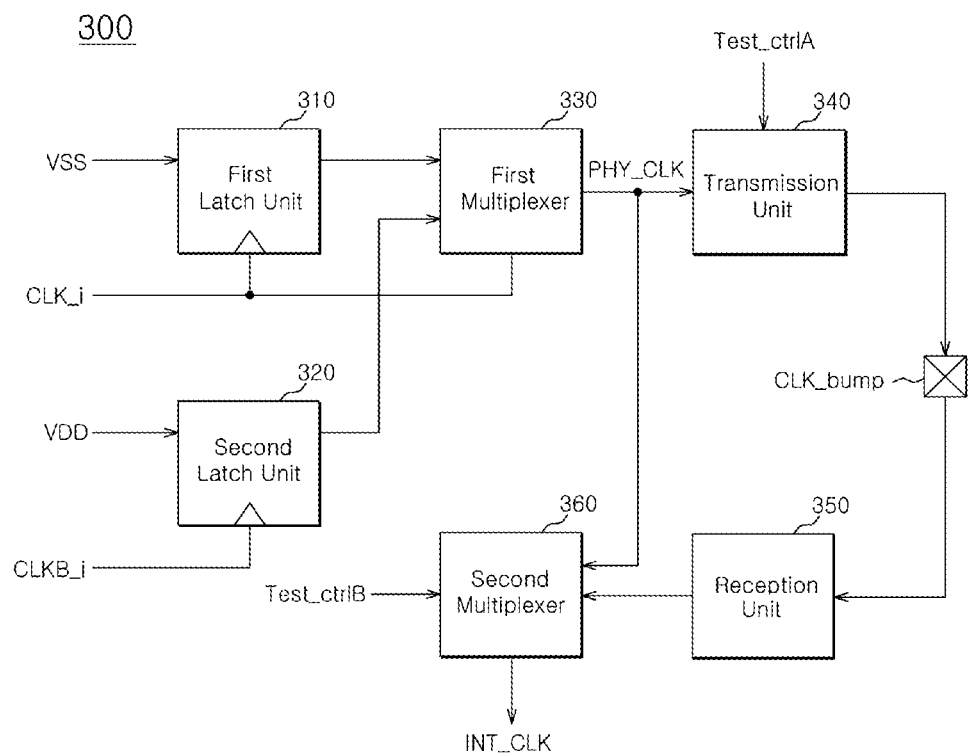
FIG. 4 is a block diagram of the clock input block of FIG. 1.

Referring to FIG. 4, the clock input block 300 may include first and second latch units 310 and 320, a first multiplexer 330, a transmission unit 340, a reception unit 350, and a second multiplexer 360.

The first latch unit 310 may be configured to latch and output a ground voltage VSS, that is, a low level signal, each time the input clock CLK_i transitions to a high level.

The second latch unit 320 may be configured to latch and output an external voltage VDD, that is, a high level signal, each time the input clock bar CLKB_i transitions to a high level.

The first multiplexer 330 may be configured to select one of output signals of the first and second latch units 310 and 320 as the PHY clock PHY_CLK in response to the input clock CLK_i. For example, the first multiplexer 330 selectively outputs the output signal of the first latch unit 310 as the PHY clock PHY_CLK when the input clock CLK_i is the high level, and selectively outputs the output signal of the second latch unit 320 as the PHY clock PHY_CLK when the input clock CLK_i is a low level.

The transmission unit 340 may be configured to be activated in response to the first test control signal Test_ctrlA, and output the PHY clock PHY_CLK to a clock bump CLK_bump. For example, the transmission unit 340 is activated when the first test control signal Test_ctrlA is enabled, and provides the PHY clock PHY_CLK to the clock bump CLK_bump. The transmission unit 340 blocks the PHY clock PHY_CLK from being transferred to the clock bump CLK_bump when the first test control signal Test_ctrlA is disabled. The transmission unit 340 may be constituted by a driver.

The reception unit 350 may be configured to transfer the PHY clock PHY_CLK which is inputted from the clock bump CLK_bump, to the second multiplexer 360. The reception unit 350 may be to constituted by a receiver.

The second multiplexer 360 may be configured to output one of the PHY clock PHY_CLK outputted from the first multiplexer 330 and the PHY clock PHY_CLK outputted from the reception unit 350 as the internal clock INT_CLK in response to the second test control signal Test_ctrlB. For example, the second multiplexer 360 selects the output of the first multiplexer 330 as the internal clock INT_CLK when the second test control signal Test_ctrlB is enabled, and selects the output of the reception unit 350 as the internal clock INT_CLK when the second test control signal Test_ctrlB is disabled.

Figure 5:
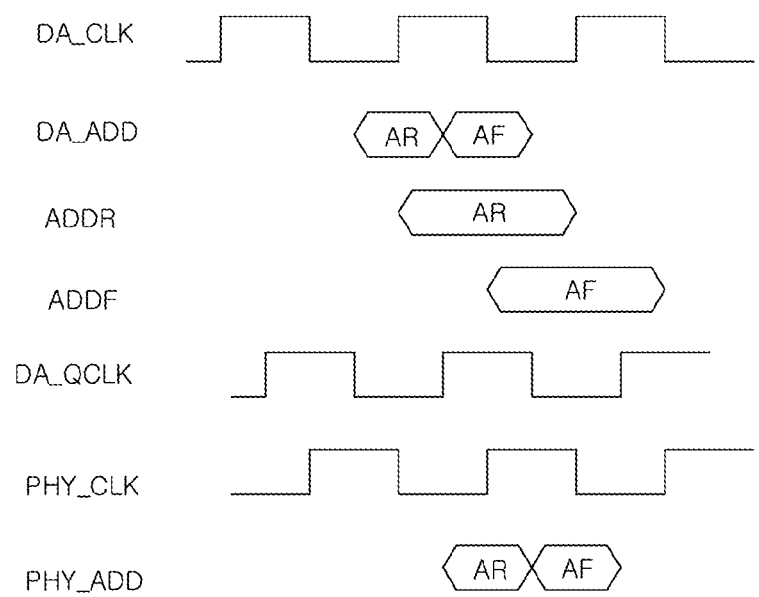
FIG. 5 is a timing diagram explaining the semiconductor memory apparatus in accordance with the embodiment of the present disclosure.

Operations of the first test input block 100, the address input block 200 and the clock input block 300 shown in FIG. 1 will be described with reference to FIG. 5.

The external clock DA_CLK and the external address DA_ADD are inputted to the first test input block 110.

A result AR of comparing the voltage levels of the external address DA_ADD and the reference voltage VREF is latched in the first latch unit 120 and outputted as the rising address ADDR from the rising timing of the external clock DA_CLK, that is, from when the external clock DA_CLK transitions to the high level until the external clock DA_CLK next transitions to the high level.

A result AF of comparing the voltage levels of the external address DA_ADD and the reference voltage VREF is latched in the second latch unit 130 and outputted as the falling address ADDF from the falling timing of the external clock DA_CLK, that is, from when the external clock DA_CLK transitions to the low level to until the external clock DA_CLK next transitions to the low level.

The rising address ADDR is outputted as the PHY address PHY_ADD during the high level period of the external write clock DA_QCLK, and the falling address ADDF is outputted as the PHY address PHY_ADD during the low level period of the external write clock DA_QCLK.

The PHY clock PHY_CLK is outputted at the level of the ground voltage VSS, that is, a low level, during the high level period of the external clock DA_CLK, and is outputted at the level of the external voltage VDD, that is, a high level, during the low level period of the external clock DA_CLK. In other words, the PHY clock PHY_CLK may have a phase opposite to the phase of the external clock DA_CLK. The external clock DA_CLK, the external clock bar DA_CLKB, the external write clock DA_QCLK and the external write clock bar DA_QCLKB shown in FIGS. 1 to 4 respectively may have the same phases as the input clock CLK_i, the input clock bar CLKB_i, the write input clock QCLK_i and the write input clock bar QCLKB_i which are outputted as the external clock DA_CLK, the external clock bar DA_CLKB, the external write clock DA_QCLK and the external write clock bar DA_QCLKB are driven. Also, the external clock DA_CLK and the external clock bar DA_CLKB have opposite phases, and the external write clock DA_QCLK and the external write clock bar DA_QCLKB have opposite phases.

Figure 6:
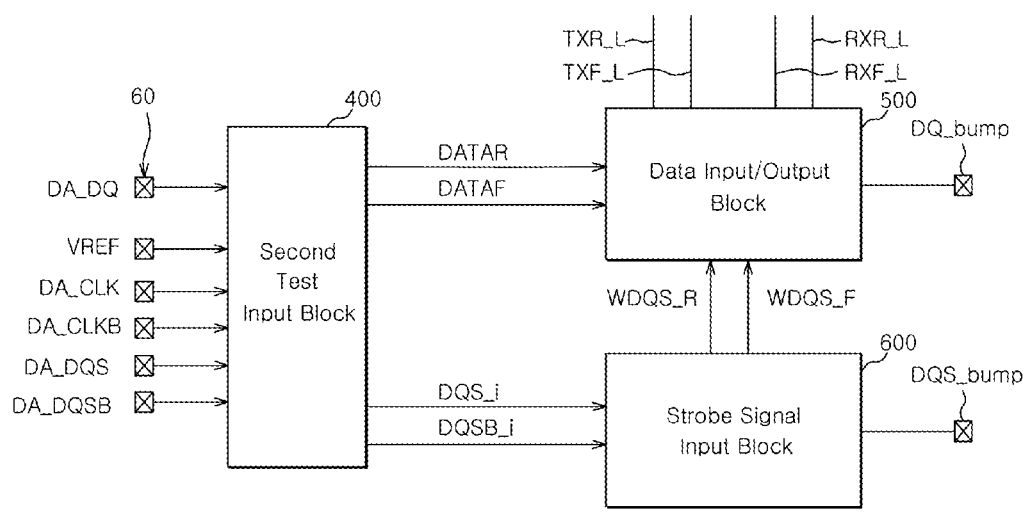
FIG. 6 is a block diagram of a semiconductor memory apparatus in accordance with an embodiment of the present disclosure.

As shown in FIG. 6, a semiconductor memory apparatus 2000 may include a second test input block 400, a data input/output block 500, and a strobe signal input block 600.

For example, the semiconductor memory apparatus 2000 shown in FIG. 6 is a device for processing data signal and the above semiconductor memory apparatus 1000 shown in FIG. 1 is a device for processing an address (or a command) and a clock.

The second test input block 400 may be configured to receive data DA_DQ, a reference voltage VREF, clocks DA_CLK and DA_CLKB and data strobe signals DA_DQS and DA_DQSB which are externally inputted from a test pad 60. The test pad 60 may be a probe pad, a direct access pad, or the like. The data DA_DQ which is externally inputted is referred to as external data DA_DQ, and the clocks DA_CLK and DA_CLKB which are externally inputted are respectively referred to as an external clock DA_CLK and an external clock bar DA_CLKB. Further, the data strobe signals DA_DQS and DA_DQSB which are externally inputted are respectively referred to as an external data strobe signal DA_DQS and an external data strobe bar signal DA_DQSB.

The second test input block 400 may be configured to compare the voltage level of the external data DA_DQ and the voltage level of the reference voltage VREF, and generate rising data DATAR as a first comparison result by synchronizing the first comparison result with the external clock DA_CLK. Further, the second test input block 400 may be configured to compare the voltage level of the external data DA_DQ and the voltage level of the reference voltage VREF, and generate falling data DATAF as a second comparison result by synchronizing the second comparison result with the external clock bar DA_CLKB. The second test input block 400 may be configured to drive the external data strobe signal DA_DQS and the external data strobe bar signal DA_DQSB, and generate an input data strobe signal DQS_i and an input data strobe bar signal DQSB_i. The data input/output block 500 may be configured to receive the rising data DATAR and the falling data DATAF from the second test input block 400. The strobe signal input block 600 may be configured to receive the input data strobe signal DQS_i and an input data strobe bar signal DQSB_i from the second test input block 400.

Figure 7:
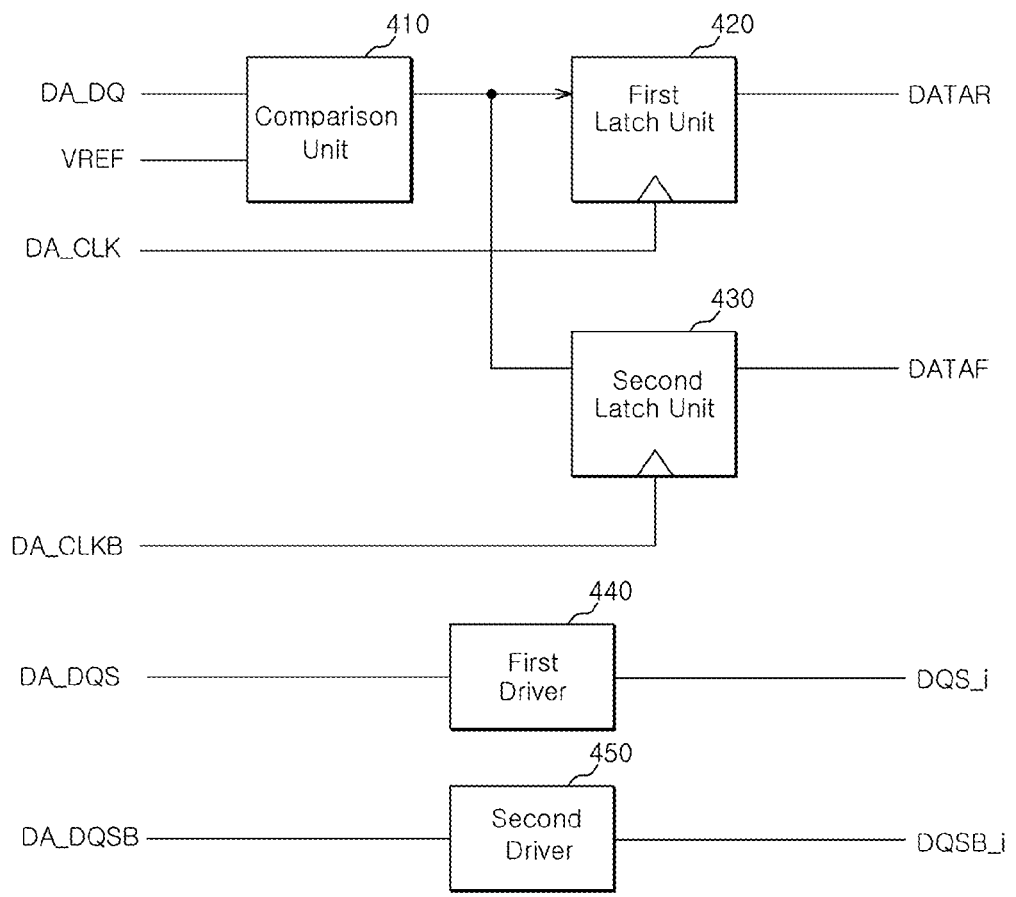
FIG. 7 is a block diagram of the second test input block of FIG. 6.

More detailed, referring to FIG. 7, the second test input block 400 may include a comparison unit 410, first and second latch units 420 and 430, and first and second drivers 440 and 450.

The comparison unit 410 may be configured to receive the external data DA_DQ and the reference voltage VREF and compare the voltage level of the external data DA_DQ and the voltage level of the reference voltage VREF. For example, the comparison unit 410 may be configured to be output a signal with a high level when the voltage level of the external data DA_DQ is higher than the voltage level of the reference voltage VREF, and output a signal with a low level when the voltage level of the external data DA_DQ is lower than the voltage level of the reference voltage VREF.

The first latch unit 420 may be configured to latch the output of the comparison unit 410 in response to the external clock DA_CLK, and output a latched signal as the rising data DATAR. For example, the first latch unit 420 may latch the output of the first comparison unit 410 at the rising timing of the external clock DA_CLK, and output the rising data DATAR.

The second latch unit 430 may be configured to latch the output of the comparison unit 410 in response to the external clock bar DA_CLKB, and output a latched signal as the falling data DATAF. For example, the second latch unit 430 may latch the output of the first comparison unit 410 at the rising timing of the external clock bar DA_CLKB, and output the falling data DATAF.

The first driver 440 may be configured to drive the external data strobe signal DA_DQS thereby outputting the input data strobe signal DQS_i.

The second driver 450 may be configured to drive the external data strobe bar signal DA_DQSB thereby outputting the input data strobe bar signal DQSB_i.

The data input/output block 500 of FIG. 6 may be configured to transfer the rising data DATAR and the falling data DATAF to first and second input data lines RXR_L and RXF_L in response to a write data strobe rising signal WDQS_R and a write data strobe falling signal WDQS_F. Also, the data input/output block 500 may be configured to receive data from first and second output data lines TXR_L and TXF_L. The data input/output block 500 may be electrically coupled with a data input/output bump DQ_bump.

Figure 8:
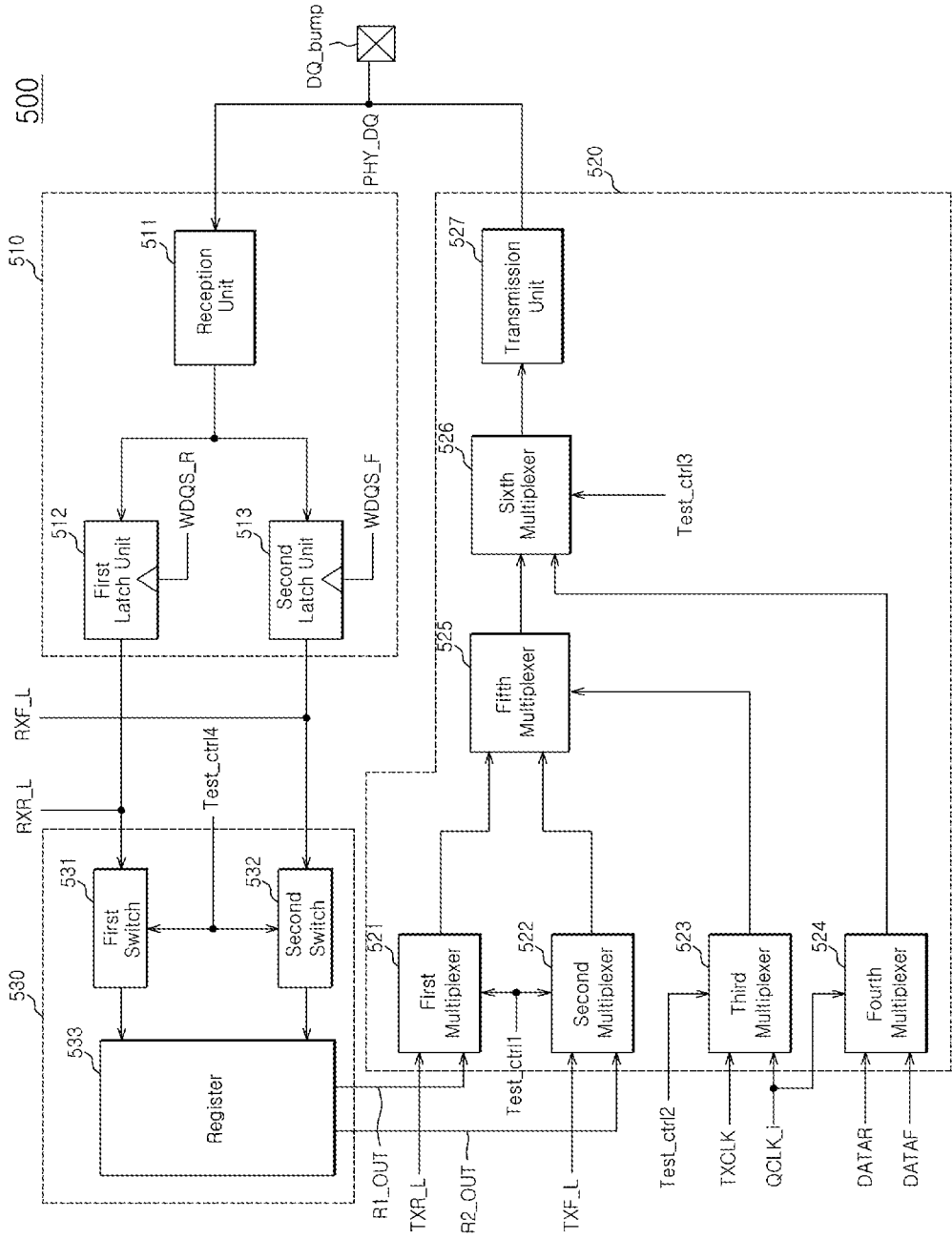
FIG. 8 is a block diagram of the data input/output block of FIG. 6.

Referring to FIG. 8, the data input/output block 500 may include a data input part 510, a data output part 520, and a temporary storage part 530.

The data input part 510 may be configured to transfer PHY data PHY_DQ inputted from the data input/output bump DQ_bump or PHY data PHY_DQ inputted from the data output part 520, to the first and second input data lines RXR_L and RXF_L in synchronization with the write data strobe rising signal WDQS_R and the write data strobe falling signal WDQS_F.

The data input part 510 may include a reception unit 511, and first and second latch units 512 and 513.

The reception unit 511 may be configured to receive the PHY data PHY_DQ and transfer the PHY data PHY_DQ to the first and second latch units 512 and 513. The reception unit 511 may be constituted by a receiver.

The first latch unit 512 may be configured to provide an output data of the reception unit 511 to the first input data line RXR_L in response to the write data strobe rising signal WDQS_R. For example, the first latch unit 512 may latch the output data of the reception unit 511 and output the latched output of the reception unit 511 to the first input data line RXR_L each time the write data strobe rising signal WDQS_R transitions to a high level.

The second latch unit 513 may be configured to provide the output data of the reception unit 511 to the second input data line RXF_L in response to the write data strobe falling signal WDQS_F. For example, the second latch unit 513 may latch the output data of the reception unit 511 and output the latched output of the reception unit 511 to the second input data line RXF_L each time the write data strobe falling signal WDQS_F transitions to a high level.

The data output part 520 may be configured to output one of the signals of the first and second output data lines TXR_L and TXF_L, output signals R1_OUT and R2_OUT of the temporary storage part 530, and the output signals DATAR and DATAF of the second test input block 400, to the data input/output bump DQ_bump and the reception unit 511 of the data input part 510.

The data output part 520 may include first to sixth multiplexers 521 to 526, and a transmission unit 527.

The first multiplexer 521 may be configured to select one of the output signal R1_OUT of the temporary storage part 530 and the signal of the first output data line TXR_L in response to a first test control signal Test_ctrl1. For example, the first multiplexer 521 may output the signal of the first output data line TXR_L when the first test control signal Test_ctrl1 is enabled, and output the output signal R1_OUT of the temporary storage part 530 when the first test control signal Test_ctrl1 is disabled.

The second multiplexer 522 may be configured to output one of the output signal R2_OUT of the temporary storage part 530 and the signal of the second output data line TXF_L in response to the first test control signal Test_ctrl1. For example, the second multiplexer 522 may output the signal of the second output data line TXF_L when the first test control signal Test_ctrl1 is enabled, and output the output signal R2_OUT of the temporary storage part 530 when the first test control signal Test_ctrl1 is disabled.

The third multiplexer 523 may be configured to select one clock of an output clock TXCLK and a write input clock QCLK_i in response to a second test control signal Test_ctrl2. For example, the third multiplexer 523 may output the write input clock QCLK_i when the second test control signal Test_ctrl2 is enabled, and output the output clock TXCLK when the second test control signal Test_ctrl2 is disabled. The output clock TXCLK may be a clock which is used for a read operation not in a testing operation but in a normal operation, and the write input clock QCLK_i may be the clock which is shown in FIG. 1.

The fourth multiplexer 524 may be configured to select one of the rising data DATAR and the falling data DATAF in response to the write input clock QCLK_i. For example, the fourth multiplexer 524 may output the rising data DATAR when the write input clock QCLK_i is a high level, and output the falling data DATAF when the write input clock QCLK_i is a low level.

The fifth multiplexer 525 may be configured to select one of the output of the first multiplexer 521 and the output of the second multiplexer 522 in response to the output of the third multiplexer 523. For example, the fifth multiplexer 525 may output the output of the first multiplexer 521 when the output of the third multiplexer 523 is a high level, and output the output of the second multiplexer 522 when the output of the third multiplexer 523 is a low level.

The sixth multiplexer 526 may be configured to output one of the output of the fifth multiplexer 525 and the output of the fourth multiplexer 524 in response to a third test control signal Test_ctrl3. For example, the sixth multiplexer 526 may output the output of the fifth multiplexer 525 to the transmission unit 527 when the third test control signal Test_ctrl3 is enabled, and output the output of the fourth multiplexer 524 to the transmission unit 527 when the third test control signal Test_ctrl3 is disabled.

The transmission unit 527 may be configured to provide the output of the sixth multiplexer 526 to the data input/output bump DQ_bump and the reception unit 511. The transmission unit 527 may be constituted by a driver.

The first and second multiplexers 521 and 522 may be component elements which select one of the outputs R1_OUT and R2_OUT of the temporary storage part 530 and the signals of the first and second output data lines TXR_L and TXF_L according to the first test control signal Test_ctrl1. The third multiplexer 523 may be a component element which selects the clock TXCLK used in a normal operation and the clock QCLK_i used in a test according to the second test control signal Test_ctrl2. The fourth multiplexer 524 may be a component element which synchronizes the rising data DATAR and the falling data DATAF with a clock used in a test, that is, the write input clock QCLK_i. The fifth multiplexer 525 may be a component element which synchronizes the outputs of the first and second multiplexers 521 and 522 with the output of the third multiplexer 523. The sixth multiplexer 526 is a component element which transfers one of the output of the fourth multiplexer 524 and the output of the fifth multiplexer 525 to the transmission unit 527 in response to the third test control signal Test_ctrl3. The data input/output bump DQ_bump may be electrically coupled to a node through which the transmission unit 527. The reception unit 511 may be electrically coupled with each other, and the signal of the node at which the transmission unit 527. The reception unit 511 and the data input/output bump DQ_bump may be electrically coupled is the PHY data PHY_DQ. Namely, the output of the transmission unit 527 may be the PHY data PHY_DQ, and the input of the reception unit 511 may be the PHY data PHY_DQ.

The temporary storage part 530 may be configured to store the outputs of the data input part 510 and transfer stored signals to the first and second multiplexers 521 and 522 of the data output part 520, in response to a fourth test control signal Test_ctrl4. For example, the temporary storage part 530 may store the outputs of the data input part 510 and provides the stored signals to the first and second multiplexers 521 and 522 of the data output part 520 when the fourth test control signal Test_ctrl4 is enabled. Further, the temporary storage part 530 does not receive the outputs of the data input part 510 and outputs the values of previously stored signals when the fourth test control signal Test_ctrl4 is disabled.

The temporary storage part 530 may include first and second switches 531 and 532, and a register 533.

The first switch 531 may be configured to transfer the output of the first latch unit 512 to the register 533 when the fourth test control signal Test_ctrl4 is enabled. The first switch 531 may be configured to block the output of the first latch unit 512 from being transferred to the register 533 when the fourth test control signal Test_ctrl4 is disabled.

The second switch 532 may be configured to transfer the output of the second latch unit 513 to the register 533 when the fourth test control signal Test_ctrl4 is enabled. The second switch 532 may be configured to block the output of the second latch unit 513 from being transferred to the register 533 when the fourth test control signal Test_ctrl4 is disabled.

The register 533 may be configured to store the outputs of the first and second switches 531 and 532, and output the stored signals to the first and second multiplexers 521 and 522. For example, the register 533 may store the output of the first switch 531, and output the stored output of the first switch 531 to the first multiplexer 521. Also, the register 531 may store the output of the second switch 532 and output the stored signal provided from the second switch 532 to the second multiplexer 522.

The strobe signal input block 600 of FIG. 6 may be configured to generate the write data strobe rising signal WDQS_R and the write data strobe falling signal WDQS_F in response to the input data strobe signal DQS_i and the input data strobe bar signal DQSB_i. Further, the strobe signal input block 600 may be electrically coupled to a data strobe bump DQS_bump, and generate the write data strobe rising signal WDQS_R and the write data strobe falling signal WDQS_F in response to the signal inputted from the data strobe bump DQS_bump in a normal operation.

Figure 9:
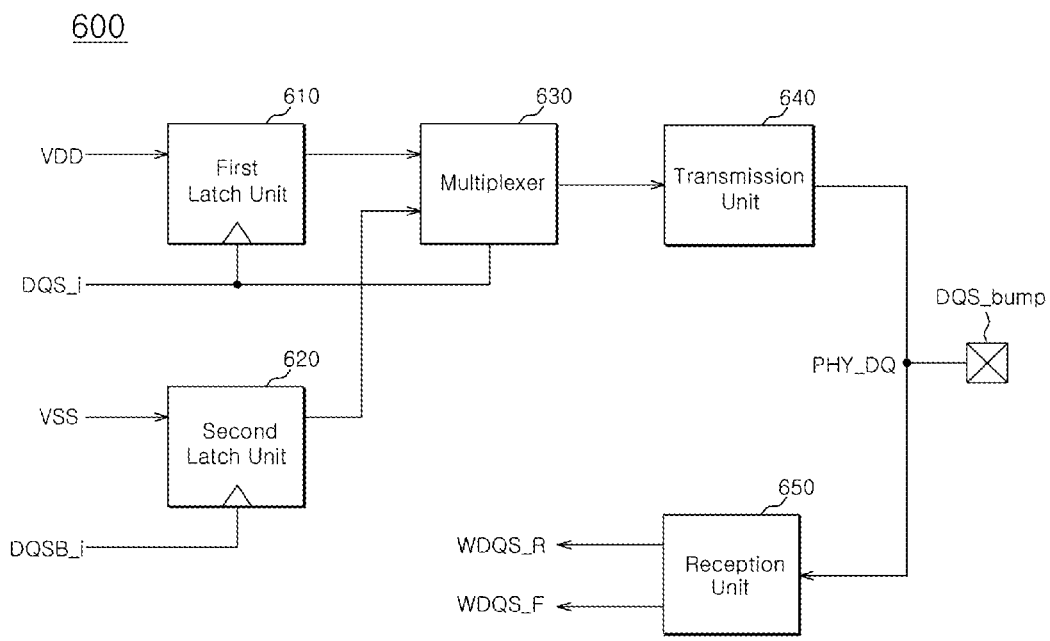
FIG. 9 is a block diagram of the strobe signal input block of FIG. 6.

Referring to FIG. 9, the strobe signal input block 600 may include first and second latch units 610 and 620, a multiplexer 630, a transmission unit 640, and a reception unit 650.

The first latch unit 610 may be configured to latch and output an external voltage VDD, that is, a high level signal, in response to the input data strobe signal DQS_i. For example, the first latch unit 610 may output the high level signal each time the input data strobe signal DQS_i transitions to a high level.

The second latch unit 620 may configured to latch and output a ground voltage VSS, that is, a low level signal, in response to the input data strobe bar signal DQSB_i. For example, the second latch unit 620 outputs the low level signal each time the input data strobe bar signal DQSB_i transitions to a high level.

The multiplexer 630 may be configured to select one of the outputs of the first latch unit 610 and the second latch unit 620 in response to the input data strobe signal DQS_i. For example, the multiplexer 630 may output the output of the first latch unit 610 to the transmission unit 640 when the input data strobe signal DQS_i is the high level, and output the output of the second latch unit 620 to the transmission unit 640 when the input data strobe signal DQS_i is a low level.

The transmission unit 640 may be configured to receive the output of the multiplexer 630, and output it to the data strobe bump DQS_bump and the reception unit 650.

The reception unit 650 may be configured to receive the signal outputted from the transmission unit 640 or the signal inputted from the data strobe bump DQS_bump and output the write data strobe rising signal WDQS_R. Further the reception unit 650 may invert the signal outputted from the transmission unit 640 or the signal inputted from the data strobe bump DQS_bump and output the write data strobe falling signal WDQS_F. The signal inputted to or outputted from a node at which the transmission unit 640, the reception unit 650 and the data strobe bump DQS_bump are electrically coupled may be a PHY data strobe signal PHY_DQ.

Figure 10:
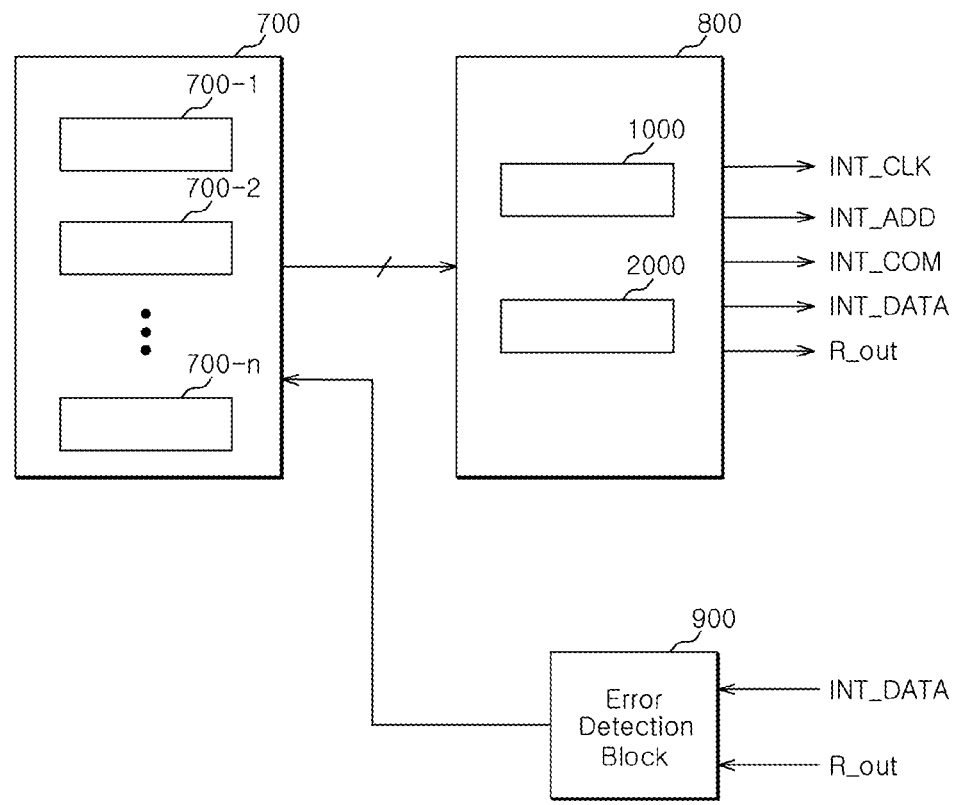
FIG. 10 is a block diagram of a semiconductor memory apparatus in accordance with an embodiment of the present disclosure, including the semiconductor memory apparatuses of FIGS. 1 and 6.
Figure 11:
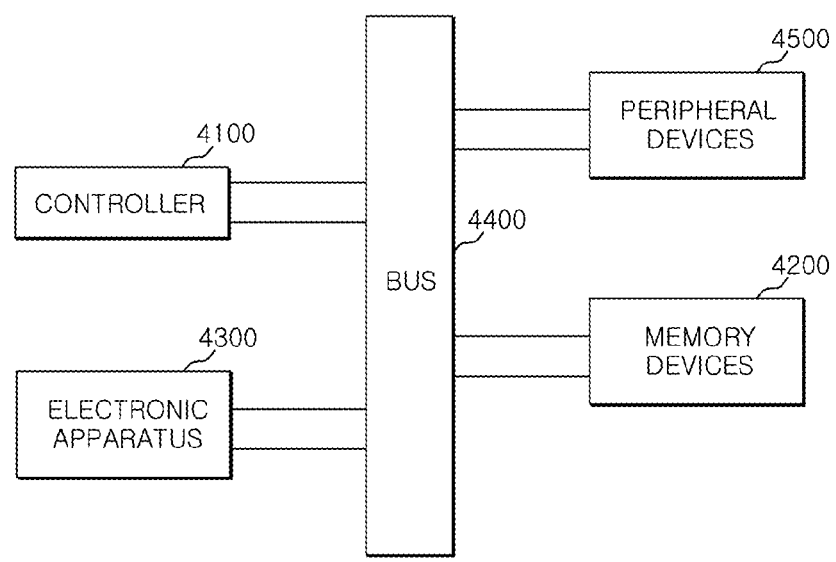
FIG. 11 is a block diagram of various features of an electronic system, according to various embodiments of the invention.

FIG. 10 shows a semiconductor memory apparatus 3000 in accordance with an embodiment of the present disclosure, in which both the semiconductor memory apparatus 1000 of FIG. 1 relating to addresses, commands and clocks and the semiconductor memory apparatus 2000 of FIG. 6 relating to data are used.

The semiconductor memory apparatus 3000 shown in FIG. 10 may include a test input/output port 700, an internal input interface 800, and an error detection block 900.

The test input/output port 700 may include a plurality of test pads 700_1, 700_2, ... and 700_n, and may be configured to transfer an address, a command, a clock and data which are applied from an external circuit device, to the internal input interface 800.

The internal input interface 800 may include the semiconductor memory apparatus 1000 shown in FIG. 1 and the semiconductor memory apparatus 2000 shown in FIG. 6, and may be configured to generate an internal clock INT_CLK, an internal address INT_ADD, an internal command INT_COM, internal data INT_DATA and temporary storage data R_out from the clock, the address, the command, the clock and the data which are inputted from the test input/output port 700. For example, the semiconductor memory apparatus 1000 shown in FIG. 1 may generate the internal address INT_ADD and the internal clock INT_CLK in response to the external address DA_ADD, the reference voltage VREF, the external clock DA_CLK and the external write clock DA_QCLK. Also, by using the semiconductor memory apparatus 1000 shown in FIG. 1, an external command may be generated as the internal command INT_COM. A configuration for generating the internal address INT_ADD and a configuration for generating the internal command INT_COM are the same with each other except that input signals and output signals thereof may be different. The semiconductor memory apparatus 2000 shown in FIG. 6 may generate the internal data INT_DATA to be inputted to the input data lines RXR_L and RXF_L, by using the external data DA_DQ, the reference voltage VREF, the external clock DA_CLK and the external data strobe signal DA_DQS. Further, as the internal data INT_DATA inputted to the input data lines RXR_L and RXF_L is stored by the register 533 (see FIG. 8), the temporary storage data R_out (R1_OUT and R2_OUT) is generated.

The error detection block 900 may be configured to compare the internal data INT_DATA and the temporary storage data R_out to detect if they are the same with each other, and output a comparison result to one test pad which is configured in the test input/output port 700. The error detection block 900 may be realized by an exclusive OR gate and an AND gate.

Operations of the semiconductor memory apparatus 1000 relating the address signal shown in FIG. 1 will be described below.

Referring to FIG. 1, the first test input block 100 generates the rising address ADDR, the falling address ADDF, the write input clock QCLK_i, the write input clock bar QCLKB_i, the input clock CLK_i and the input clock bar CLKB_i in response to the external address DA_ADD, the reference voltage VREF, the external clock DA_CLK, the external clock bar DA_CLKB, the external write clock DA_QCLK and the external write clock bar DA_QCLKB using the an address DA_ADD, a reference voltage VREF and clocks DA_CLK, DA_CLKB, DA_QCLK and DA_QCLKB.

The address input block 200 generates the internal address INT_ADD in response to the rising address ADDR, the falling address ADDF, the write input clock QCLK_i and the write input clock bar QCLKB_i using the rising address ADDR, the falling address ADDF, write input clock QCLK_i and the write input clock bar QCLKB_i from the first test input block 100.

In detail, referring to FIG. 3, in a test, the first test control signal Test_ctrlA is enabled, and the PHY address PHY_ADD generated by the first multiplexer 230 is outputted to the address bump ADD_bump and the reception unit 250. The reception unit 250 receives the output of the transmission unit 240 and outputs it to the second multiplexer 260. In the case where the second test control signal Test_ctrlB is disabled, the second multiplexer 260 selects and outputs the output of the reception unit 250 as the internal address INT_ADD. The PHY address PHY_ADD is generated from the rising address ADDR and the falling address ADDF which are generated from the external address DA_ADD, the reference voltage VREF, the external clock DA_CLK and the external clock bar DA_CLKB inputted from a test pad. As the PHY address PHY_ADD is inputted to the reception unit 250 through the address bump ADD_bump, the same path as the path of the address which is inputted to the reception unit 250 from the address bump ADD_bump in a normal operation is formed. In the case where it is necessary to use the PHY address PHY_ADD not having passed through the transmission unit 240 and the reception unit 250, as the internal address INT_ADD, the second test control signal Test_ctrlB is disabled.

A configuration for generating an external command as an internal command is the same as the configuration for generating the external address DA_ADD as the internal address INT_ADD.

The clock input block 300 generates the internal address INT_ADD in response to the input clock CLK_i and the input clock bar CLKB_i.

In detail, referring to FIG. 4, the output of the first multiplexer 330, that is, the PHY clock PHY_CLK is outputted as the internal clock INT_CLK through the transmission unit 340, the clock bump CLK_bump, the reception unit 350 and the second multiplexer 360. In this case, in the same manner as in the normal operation, the reception unit 350 receives a signal from the clock bump CLK_bump and outputs the internal clock INT_CLK through the second multiplexer 360. Further, under the control of the first and second test control signals Test_ctrlA and Test_ctrlB, the output of the first multiplexer 330 is outputted as the internal clock INT_CLK directly through the second multiplexer 360 without passing through the clock bump CLK_bump and the reception unit 350.

Therefore, the semiconductor memory apparatus 1000 shown in FIG. 1 may input the internal address INT_ADD, the internal command INT_COM and the internal clock INT_CLK to other internal circuits through the same input paths of an address, a command and a clock as in the normal operation, in a test.

Operations of the semiconductor memory apparatus 2000 relating data shown in FIG. 6 will be described below.

The second test input block 400 generates the rising data DATAR, the falling data DATAF, the input data strobe signal DQS_i and the input data strobe bar signal DQSB_i in response to the external data DA_DQ, the reference voltage VREF, the external clock DA_CLK, the external clock bar DA_CLKB, the external data strobe signal DA_DQS and the external data strobe bar signal DA_DQSB.

The data input/output block 500 outputs the PHY data PHY_DQ (see FIG. 8) to the first and second input data lines RXR_L and RXF_L as the internal data INT_DATA in response to the rising data DATAR, the falling data DATAF, the write data strobe rising signal WDQS_R and the write data strobe falling signal WDQS_F. Also, the data input/output block 500 may output the data received from the first and second output data lines TXR_L and TXF_L to the data bump DQ_bump.

In detail, referring to FIG. 8, the data input/output block 500 includes the data input part 510, the data output part 520, and the temporary storage part 530.

The data input part 510 transfers the PHY data PHY_DQ to the first and second input data lines RXR_L and RXF_L.

The data output part 520 selects one of the signals of the first and second output data lines TXR_L and TXF_L, the output signals R1_OUT and R2_OUT of the register 533, and the rising data DATAR and the falling data DATAF in response to the first to third test control signals Test_ctrl1, Test_ctrl2 and Test_ctrl3, and generates the PHY data PHY_DQ according to selected signals.

Thus, it is possible to input data through the same data paths as in a normal operation in which data pass from the data input part 510 through the input data lines RXR_L and RXF_L.

The temporary storage part 530 may store the data inputted through the first and second input data lines RXR_L and RXF_L and may output the temporary storage data R1_OUT and R2_OUT.

Referring to FIG. 10, the semiconductor memory apparatus 3000 in accordance with the embodiment of the present disclosure may input an address, a clock, a command and data through the same paths including the test input/output port 700 as in a normal operation, in a test. Because the semiconductor memory apparatus may input an address, a clock, a command and data through the same paths including the test input/output port 700 as in a normal operation, in a test, the semiconductor memory apparatus may perform a normal operation such as of outputting stored data and storing inputted data, in a test. Further, because an address, a clock, a command and data may be inputted to the semiconductor memory apparatus through the reception units which are electrically coupled with respective bumps for an address, a clock, a command and data inputted from an outside, it is possible to check whether the respective reception units normally operate.

As the error detection unit 900 is included, it is possible to detect whether the internal data INT_DATA inputted to the semiconductor memory apparatus and the temporary storage data R_out are the same with each other, whereby it is possible to check whether the data input part 510 and the data output part 520 operate normally. In detail, the output of the data output part 520 may be stored in the temporary storage part 530 through the data input part 510, and the output of the temporary storage part 530 may be inputted to the data output part 520. Therefore, since the same data may be inputted to the data input part 510 and the data output part 520, by comparing temporary storage data and the data outputted from the data input part 510, it is possible to check whether the data input part 510 and the data output part 520 operate normally.

By disposing the semiconductor memory apparatus 3000 of FIG. 10 in respective channels, the channels may be respectively tested.

FIG. 17 shows a block diagram of various features of an electronic system 4000, according to various embodiments of the invention. System 4000 can include a controller 4100 and a memory device 4200. Memory device 4200 can be configured as a semiconductor integrated circuit, in accordance with embodiments taught herein, and may be similar to or identical to one or more of the embodiments discussed with respect to FIGS. 1-10. System 4000 may be formed in various ways such as coupling the individual components of system 4100 together or integrating the components into one or a number of chip-based units using conventional techniques. In an embodiment, system 4000 also includes an electronic apparatus 4300 and a bus 4400, where the bus 4400 provides electrical conductivity among the components of system 4000. In an embodiment, the bus 4400 includes an address bus, a data bus, and a control bus, each independently configured. In an alternative embodiment, the bus 4400 uses common conductive lines for providing one or more of address, data, or control, the use of which is regulated by controller 4100. In an embodiment, electronic apparatus 4300 may include additional memory for the intended functional applications of electronic system 4000.

The memory device 4200 are not limited to, dynamic random access memory, static random access memory, synchronous dynamic random access memory (SDRAM), synchronous graphics random access memory (SGRAM), double data rate dynamic ram (DDR), and double data rate SDRAM, arranged according to the various embodiments as taught herein. The memory device 4200, in accordance with various embodiments as illustrated in FIGS. 1-10, may be realized in the read operation and the write operation using the test pads.

In various embodiments, peripheral device or devices 4500 are coupled to the bus 4400. Peripheral devices 4400 may include displays, imaging devices, printing devices, wireless devices, wireless interfaces (e.g. wireless transceivers), additional storage memory, control devices that may operate in conjunction with controller 4100. In an embodiment, controller 4100 may include one or more processors. In various embodiments, system 4100 includes, but is not limited to, fiber optic systems or devices, electro-optic systems or devices, optical systems or devices, imaging systems or devices, and information handling systems or devices such as wireless systems or devices, telecommunication systems or devices, and computers.

As is apparent from the above descriptions, the semiconductor memory apparatus according to the embodiments of the present disclosure may test normal operations of a semiconductor memory apparatus by using test pads.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor integrated circuit comprising:
   a test input/output port including a plurality of test pads;
   an internal input interface configured to generate an internal clock, an internal address, an internal command, internal data and temporary storage data in response to external signals through the test input/output port; and
   an error detection block configured to determine whether the internal data and the temporary storage data are the same with each other, and output a determination result through one test pad of the test input/output port,
   wherein the internal input interface includes a data input/output block which generates the internal data, and wherein the data input/output block comprises:
   a temporary storage part which stores the internal data as the temporary storage data;
   a data output part which receives the temporary storage data; and
   a data input part which receives an output of the data output part and outputs it as the internal data.

2. The semiconductor integrated circuit according to claim 1, wherein each of the plurality of test pads comprises a probing pad or a direct access pad.

3. The semiconductor integrated circuit according to claim 1, wherein the internal input interface is configured to compare voltage levels of a reference voltage and an external address and output the internal address, the internal command and the internal data.

4. The semiconductor integrated circuit according to claim 3, wherein the internal input interface comprises:

a test input block configured to generate a rising address, a falling address, a write input clock and an input clock in response to the external address, a reference voltage, an external clock and an external write clock which are applied from the test input/output port;

an address input block configured to generate a PHY (physical layer) address in response to the rising address, the falling address and the write input clock, and output the PHY address as the internal address; and a clock input block configured to generate a PHY clock in response to the input clock, and output the PHY clock as the internal clock.

5. The semiconductor integrated circuit according to claim 4,
wherein the test input block is configured to compare a voltage level of the external address and the voltage level of the reference voltage and output a comparison result as the rising address and the falling address in synchronization with the external clock,
wherein the test input block drives the external clock and outputs the input clock, and
wherein the test input block drives the external write clock and outputs the write input clock.

6. The semiconductor integrated circuit according to claim 4,
wherein the address input block generates the PHY address by synchronizing the rising address and the falling address with the write input clock, and
wherein the address input block comprises:
a transmission unit configured to output the PHY address to an address bump and a reception unit in response to a first test control signal;
the reception unit configured to output a signal which is transferred from the transmission unit or the address bump; and
a multiplexer configured to output the PHY address as the internal address or output an output of the reception unit as the internal address, in response to a second test control signal.

7. The semiconductor integrated circuit according to claim 6, wherein the address bump is electrically coupled to a node at which the transmission unit and the reception unit are electrically coupled.

8. The semiconductor integrated circuit according to claim 4, wherein the clock input block generates the PHY clock by synchronizing an external voltage and a ground voltage with the input clock.

9. The semiconductor integrated circuit according to claim 8 wherein the clock input block comprises:
a transmission unit configured to transfer the PHY clock to a clock bump and a reception unit in response to the first test control signal;
the reception unit configured to output a signal which is transferred from the clock bump or the transmission unit; and
a multiplexer configured to output the PHY clock as the internal clock or output an output of the reception unit as the internal clock, in response to the second test control signal.

10. The semiconductor integrated circuit according to claim 9, wherein the clock bump is electrically coupled to a node at which the transmission unit and the reception unit are electrically coupled.

11. The semiconductor integrated circuit according to claim 3, wherein the internal input interface comprises:
a test input block configured to generate rising data, falling data and an input data strobe signal in response to external data, the reference voltage, an external clock and an external data strobe signal which are applied from the test input/output port;
the data input/output block configured to transfer the rising data and the falling data to input data lines as the internal data by synchronizing them with a write data strobe rising signal and a write data strobe falling signal; and
a strobe signal generation block configured to generate the write data strobe rising signal and the write data strobe falling signal in response to the input data strobe signal.

12. The semiconductor integrated circuit according to claim 11,
wherein the test input block is configured to compare a voltage level of the external data and a voltage level of the reference voltage and generates the rising data and the falling data by synchronizing a comparison result with the external clock, and
wherein the test input block drives the external data strobe signal and outputs the input data strobe signal.

13. The semiconductor integrated circuit according to claim 12, wherein the data input/output block comprises:
the data input part configured to transfer an output signal of a data bump or the data output part to the input data lines by synchronizing it with the write data strobe rising signal and the write data strobe falling signal;
the data output part configured to output one of signals of output data lines, output signals of the temporary storage part, and the rising data and the falling data, in synchronization with the write input clock in response to first to third test control signals; and
the temporary storage part configured to store data which are transferred to the input data lines by the data input part, in response to a fourth test control signal, and output stored data to the data output part.

14. The semiconductor integrated circuit according to claim 13,
wherein the data output part is configured to select one of the signals of the output data lines and the output signals of the temporary storage part in response to the first test control signal, select one of an output clock and the write input clock in response to the second test control signal, and output a first signal by synchronizing the signal selected by the first test control signal with the clock selected by the second test control signal,
wherein the data output part is configured to output a second signal by synchronizing the rising data and the falling data with the write input clock,
wherein the data output part is configured to select one of the first signal and the second signal in response to the third test control signal, and outputs a third signal, and
wherein the data output part is configured to receive the third signal and transfers it to the data bump and the data input part.

15. The semiconductor integrated circuit according to claim 13,
wherein the temporary storage part is configured to store the data which are transferred to the input data lines by the data input part, and outputs stored data to the data output part, when the fourth test control signal is enabled, and
wherein the temporary storage part is configured to prevent the data of the input data lines from being stored therein when the fourth test control signal is disabled.

16. The semiconductor integrated circuit according to claim 13, wherein the data bump is electrically coupled to a node at which the data input part and the data output part are electrically coupled, in common.

17. The semiconductor integrated circuit according to claim 11,
  wherein the strobe signal generation block is configured to synchronize an external voltage and a ground voltage with the input data strobe signal, and
  wherein the strobe signal generation block comprises:
  a transmission unit configured to transfer a signal synchronized with the input data strobe signal to a data strobe bump and a reception unit as a PHY data strobe signal; and
  the reception unit configured to output a signal which is transferred from the transmission unit or the data strobe bump, as the write data strobe rising signal, and output the write data strobe falling signal which has an opposite phase to the write data strobe rising signal.

18. The semiconductor integrated circuit according to claim 17, wherein the data strobe bump is electrically coupled to a node at which the transmission unit and the reception unit are electrically coupled.

19. A system comprising a semiconductor integrated circuit block:
  wherein the semiconductor integrated circuit block comprises:
  a test port including a plurality of test pads;
  an internal input interface configured to generate an internal signal and temporary storage data using the external signals provided through the test port; and
  an error detection block configured to compare the internal signal and the temporary storage data and output a comparing result through selected one of the plurality of test pads.

* * * * *